United States Patent
Kuriyaki et al.

[11] Patent Number: 5,807,411
[45] Date of Patent: Sep. 15, 1998

[54] METHOD OF MAKING A PHOTO-RECHARGEABLE STORAGE BATTERY

[75] Inventors: Hisao Kuriyaki; Kazuyoshi Hirakawa, both of Fukuoka; Teruaki Nomiyama, Kagoshima, all of Japan

[73] Assignee: Kyushu University, Fukuoka Pref., Japan

[21] Appl. No.: 824,795

[22] Filed: Mar. 26, 1997

Related U.S. Application Data

[62] Division of Ser. No. 621,031, Mar. 22, 1996, Pat. No. 5,672,444.

[30] Foreign Application Priority Data

Aug. 24, 1995 [JP] Japan .................................. 7-215779

[51] Int. Cl.$^6$ .................................................. H01M 10/38
[52] U.S. Cl. ........................................... 29/623.5; 429/213
[58] Field of Search ............................... 29/623.5; 429/213

[56] References Cited

U.S. PATENT DOCUMENTS 4,338,180  7/1982  Nakamura .
5,219,679  6/1993  Abraham et al. .

Primary Examiner—John S. Maples
Attorney, Agent, or Firm—Spencer & Frank

[57] ABSTRACT

A method of manufacturing a photo-rechargeable storage battery includes cutting a filter paper of glass fiber as a base material in a preselected shape to provide a cut filter paper; washing the cut filter paper; coating a polypyrrole film on at least a portion of a surface of the cut filter paper; and carrying a gel of poly-tungustic acid having a form of clusters on at least a portion of the glass fiber coated with the polypyrrole film thereby forming a composite electrode on the filter paper.

4 Claims, 7 Drawing Sheets

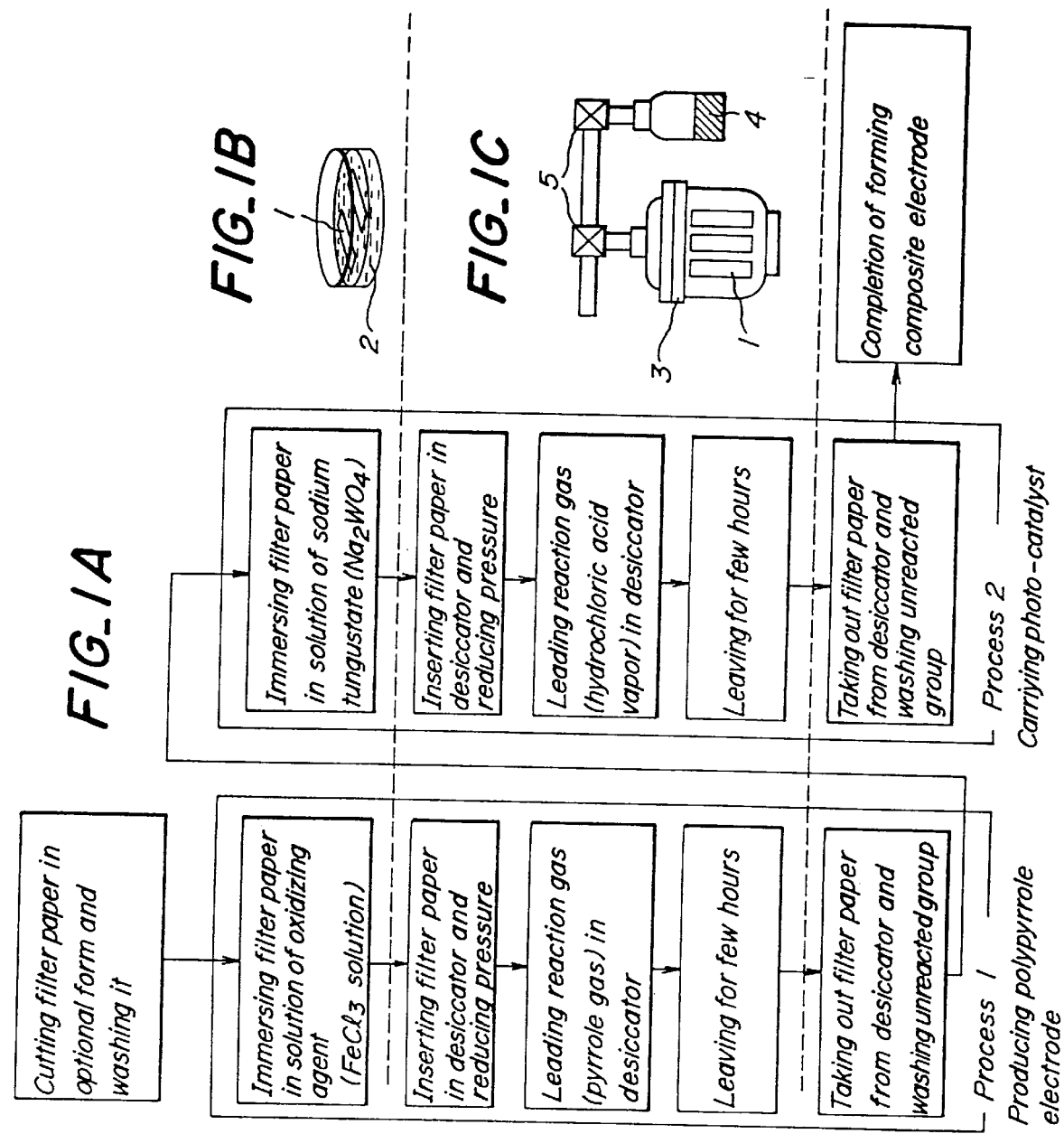

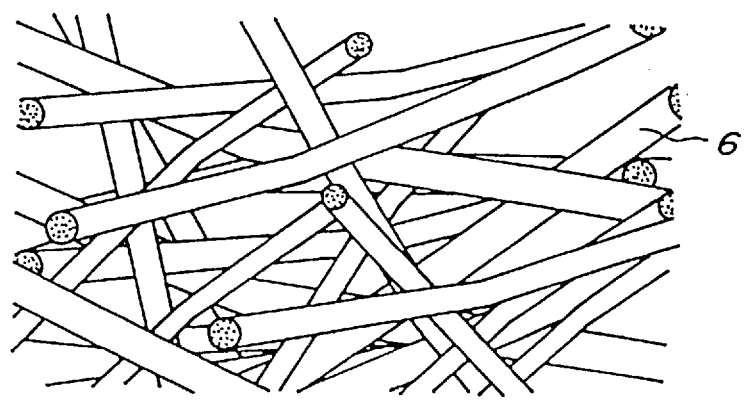
FIG._2A
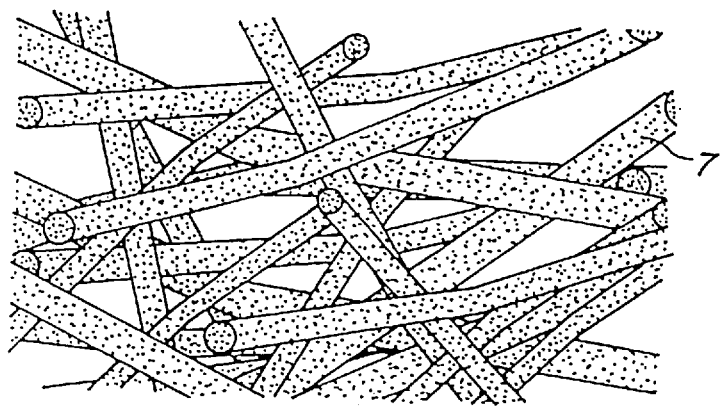
FIG._2B
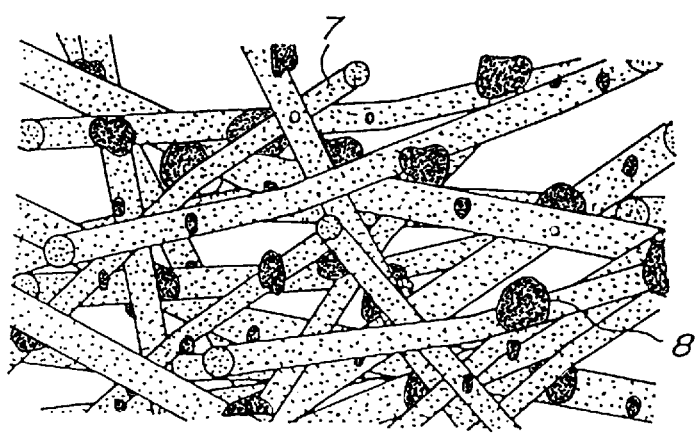
FIG._2C
⊢—⊣
4 μm

FIG._4

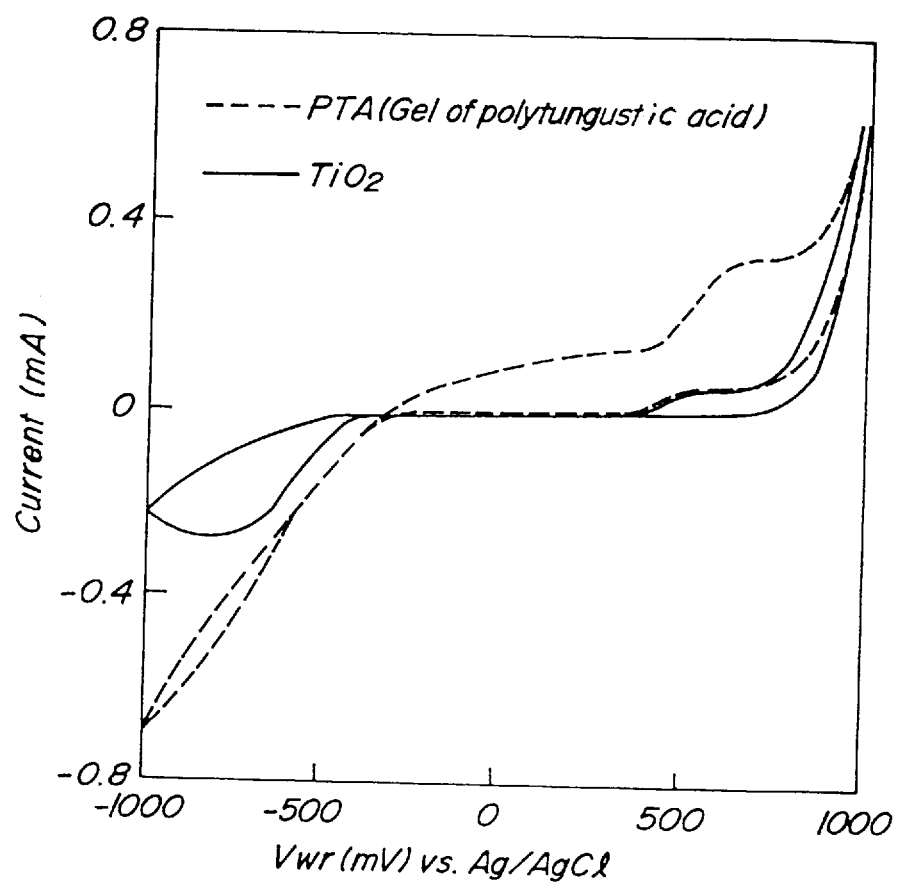
FIG_7

METHOD OF MAKING A PHOTO-RECHARGEABLE STORAGE BATTERY

This is a division of application Ser. No. 08/621,031, filed Mar. 22, 1996, now U.S. Pat. No. 5,672,444.

BACKGROUND OF THE INVENTION

1. Field of the Invention

The present invention relates to a photo-rechargeable storage battery having an electron storage property with light different from a solar cell, particularly capable of large areas and having high efficiency, and particularly to a manufacture of a new semiconductor electrode having extremely an large ratio of surface area and a large photo reactive site.

Also, the present invention relates to an electrode material for optical energy conversion used for a photo rechargeable storage battery, a solar cell or the like.

A photo rechargeable storage battery is a device capable of performing optical energy conversion and recharging with a unit electrode.

2. Related Art Statement

Hitherto, a photo rechargeable storage battery was investigated employing one substance having both semiconductivity and an electron storing property, but in this case, the energy conversion efficiency and the electron storing efficiency are low, respectively, and its practical utilization is still a long way off. As an electrode material, a layer compound semiconductor (intercalation compound semiconductor) and a macromolecular material having semiconductivity were studied. In this case, however, in addition to the above various low efficiencies, manufacturing steps become complicated, and it is difficult to put this material to practical use as a solar light device requiring large area. Therefore, it is necessary to develop an electrode having sufficient energy conversion and storing efficiencies, and to obtain a method of easily manufacturing the electrode having large area with simple fabricating steps.

That is, the material capable of putting it to practical use is not found, since the dissolution of the electrode or the like arises in the intercalation compound. Moreover, in the usual silicon solar cell, it is possible to make an area of vapor deposition film large, but in the intercalation compound having photo rechargeable property, such a manufacturing method is not established, so that this becomes a large stretch to put to practical use.

Moreover, a macromolecular material (polythiophene or the like) having a semiconductive property is also known as a electrode material for photo rechargeable storage battery, but for the photo rechargeable property, enough efficiency to obtain it, as in the intercalation compound can not be obtained. In this way, an electrode material of practical utility for a photo rechargeable storage battery has been not yet reported.

Therefore, it is necessary to manufacture an electrode having sufficient energy conversion efficiency and storage efficiency. Photo-recharging consists of two reactions, that is, a reaction of separating photo excitation carriers in a semiconductor and a reaction of recharging the carriers. A conventional electrode material is a material having both a semiconductor property and charging capability, so that it is difficult to find or synthesize a material having suitable characteristic from the viewpoint of both of the above considerations.

SUMMARY OF THE INVENTION

The present invention is based on the fact that processes of light-energy conversion and charging are performed respectively by utilizing different materials, and these materials are composed to form a composite electrode, and then, this composition is performed with few micron unit by noting microscopic property of the electrode, thereby obtaining realization of photo-rechargeable property with high efficiency.

Moreover, in order to put it to practical use, it is also necessary to manufacture the electrode having large area with simple manner. To this end, a conductive polymer as a charging electrode and a semiconductor performing light-energy conversion are polymerized with a filter paper as a base material in vapor phase, thereby forming a composite electrode capable of utilizing respective fibers of the filter paper as an electrode.

It is an object of the present invention to eliminate the above described disadvantages of the conventional photo-rechargeable storage battery.

It is another object of the present invention to provide a high performance photo-rechargeable storage battery capable of making an area of the battery large, and a method of manufacturing the same.

It is other object of the present invention to provide a method of manufacturing a semiconductor electrode having very large specific surface area by leading a polymerization of a filter paper as a base material in vapor phase, and by manufacturing an electrode on fiber of the filter paper and fixing a semiconductor material on the electrode in the form of fine particle, in the manufacturing process of a solar light energy device, and thus to provide a practical storage battery capable of charging with light.

According to the present invention, there is provided a photo-rechargeable storage battery comprising a composite electrode, said electrode being manufactured by vapor phase-polymerizing a polypyrrole and a gel of polytungstic acid on a filter paper, this composite electrode being utilized as an electrode of the storage battery.

According to the present invention, in order to manufacture the photo-rechargeable storage battery capable of being charged with light, on the assumption that the manufacturing method is simple and expensive material is not utilized, the composite electrode is manufactured by making a conductive polymer as a base. As a method of making efficiency high, in order to manufacture an electrode having large specific surface area per unit area, the technique of coating conductive polymer on the surface of the fiber of filter paper and the technique of adhering material having photo-catalytic property on the conductive polymer film in the form of a cluster are developed, thereby manufacturing a high performance photo-rechargeable storage battery, finally.

In an embodiment of the photo-rechargeable storage battery according to the present invention, there is provided a photo-rechargeable storage battery comprising a composite electrode, said electrode comprising a filter paper of glass fiber as a base material, a polypyrrole film coated on a surface of the filter paper, and an electrode formed by carrying a gel of polytungstic acid on the glass fiber coated with the polypyrrole film in the form of cluster shape.

According to the present invention, there is provided a method of manufacturing a photo-rechargeable storage battery comprising a composite electrode, the manufacture of said composite electrode comprising steps of:

preparing a filter paper of a glass fiber as a base material,
immersing a sodium tungstate into the filter paper, and,
introducing a hydrochloric acid as a catalytic vapor into the immersed filter paper in a gas phase, thereby forming a fine electrode with the utilization of chemical polymerization at the fiber surface, and repeating these steps, thereby forming an electrode having an extremely large ratio of surface area capable of adding different functions with the use of a vapor phase polymerization.

In a further preferable embodiment of the method according to the present invention, there is provided a method of manufacturing a photo-rechargeable storage battery comprising a composite electrode, the manufacture of said composite electrode comprising steps of:

cutting a filter paper of glass fiber as a base material in an optional form, washing the cut filter paper, coating a polypyrrole film on the surface of the filter paper, and carrying a gel of polytungstic acid on the glass fiber of the coated the polypyrrole film on the surface of the filter paper in the form of cluster shape, thereby forming an electrode.

In the other method of manufacturing a photo-rechargeable storage battery according to the present invention, the method comprises a composite electrode, the manufacture of said electrode comprising a step of producing a polypyrrole electrode, and a step of carrying photo-catalyst on the polypyrrole electrode, the polypyrrole electrode producing step comprising steps of:

cutting a filter paper of glass fiber as a base material in an optional form, washing the cut filter paper, immersing the washed filter paper in solution of oxidizing, masking the required portion of the filter paper, inserting the masked filter paper in a desiccator and reducing pressure in the desiccator, leading pyrrole gas in the desiccator, leaving it for required hours, taking out the filter paper from the desiccator, washing unreacted group, and the photo-catalyst carrying step comprising steps of:

immersing the thus treated filter paper in solution of sodium tungstate, masking the required portion of the immersed filter paper, inserting the masked filter paper in the desiccator and reducing pressure in the desiccator, leading hydrochloric acid vapor as a reaction gas in the desiccator, leaving it for required hours, taking out the filter paper from the desiccator, and washing unreacted group, thereby forming a composite electrode on the filter paper by a vapor phase polymerization method.

According to the present invention, as described above, a glass fiber filter paper is used as a base material, oxidation catalyst is previously immersed in the filter paper, the immersed filter paper is inserted in the desiccator, pressure is reduced, and then, the conductive polymeric monomer capable of being charged is lead in the desiccator. This process makes the conductive polymer polymerized, thereby coating respective fibers of the filter paper with rechargeable polymer film. As in the same manner, the thus coated filter paper is immersed in a solution of polytungustic acid, and is treated with hydrochloric acid vapor, so that gel of oxidized tungstic acid becomes particle shape of order of few $\mu$m, and fixed on the fiber coated with polymer. Therefore, the respective fibers of the filter paper become a photo-electrode which is formed of fixed gel of tungstic acid having semiconductor property, so that the electrode having very large specific surface area and the photo-reaction site can be manufactured.

In the present invention, respective fibers of the filter paper are coated with polymer causing rechargeable reaction by polymerizing vaporized polymeric monomer with glass fiber filter paper immersed in solution of oxidizing agent. Moreover, the gel of polytungustic acid having particle diameter of few $\mu$m and exhibiting semiconductor property is fixed. This manufacturing process may be realized with the same fabricating apparatus and the same steps, so that this manufacturing method is very simple and the electrode with very large area can easily be made by using inexpensive filter paper as a base material and by manufacturing the electrode in vapor phase.

Moreover, in the electrode made by using inexpensive filter paper as a base material and by manufacturing it in vapor phase, respective fibers become an electrode, so that the electrode has very large specific surface area for apparent area and thus the current density per unit area may be improved largely. Also, polytungustic acid having semiconductor property can be fixed in the form of particle having particle diameter of few $\mu$m, so that light-energy conversion can be realized with high efficiency.

BRIEF DESCRIPTION OF THE DRAWINGS

FIGS. 1(A), 1(B) and 1(C) are a step summary view showing manufacturing procedure of a composite electrode using a filter paper in a vapor phase, an explanatory view of treating the filter paper in a solution, and a diagram of a vapor reaction treating apparatus in a desiccator according to the present invention;

FIG. 2(A) is a microstructure view showing a surface state (condition) of fiber of the filter paper before treating with a scanning electron microscope observation;

FIG. 2(B) is a microstructure view of the fiber after polypyrrole coating treatment showing a state of adhering the polypyrrole conductive film on the surface without destroying the structure of the filter paper;

FIG. 2(C) is a microstructure view of fiber of the filter paper electrode after a treatment of gel of polytungustic acid showing that the gel is diffused and fixed with the particle diameter of few $\mu$m;

FIG. 7 is a characteristic view obtained by comparing a cyclic voltamograph in case of carrying $TiO_2$ of different photo-catalyst and sol of polytungustic acid on the electrode of polypyrrole filter paper according to the present invention.

DETAILED EXPLANATION OF THE PREFERRED EMBODIMENT

Figure 3:
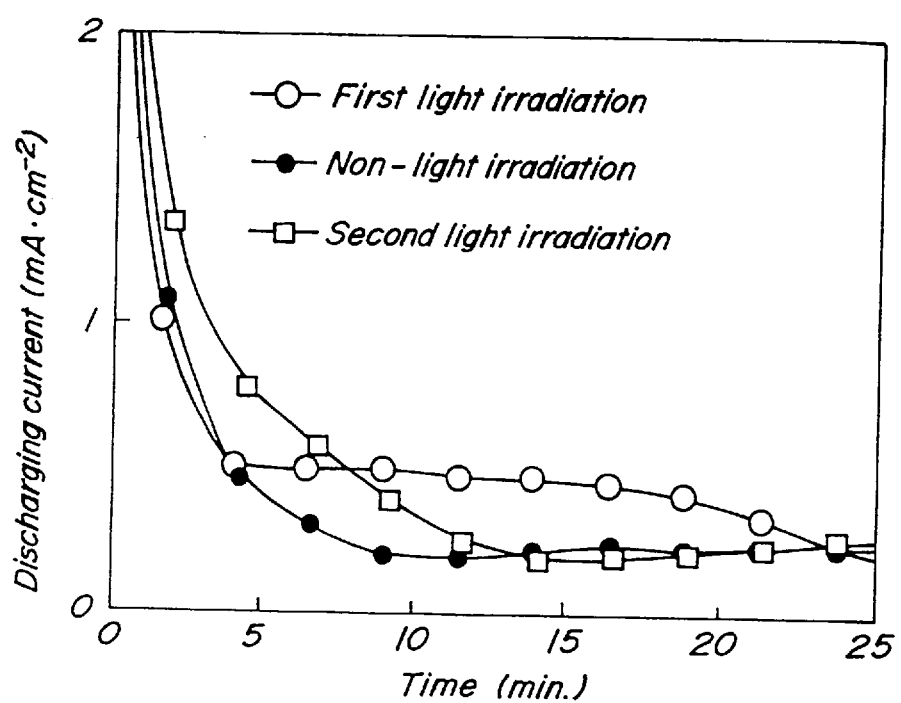
FIG. 3 is a characteristic view showing a relationship between a discharging current and a lapse of time in the cases of first light irradiation on the composite electrode according to the present invention, of non-light irradiation, and of second light irradiation, respectively.

In the drawings, there is shown an embodiment of a photo-rechargeable storage battery according to the present invention. As an embodiment, a method of manufacturing an electrode in a vapor phase with the use of a filter paper is explained with reference to FIG. 1 where valves 5 control gas flows. In this embodiment, polypyrrole is selected as a rechargeable material, and a gel of polytungustic acid is selected as a light-energy conversion material. The method of manufacturing an electrode in a vapor phase with the use of a filter paper is concretely shown in FIG. 1. At first, a glass fiber filter paper 1 is cut out in an optional form, and is washed with distilled water. In this example, the filter paper is cut out in 1×4 $cm^2$ and immersed in a solution 2 of oxidizing agent (solution of $FeCl_3$) so as to form a polypyrrole film on the surface of the filter paper. Then, the filter paper thus treated is masked at a required site, inserted in a desiccator, 3 and subjected to a reduced pressure treatment by a vacuum pump for few minute. Then, pyrrole vapor generated from pyrrole in liquid phase 4 which is held in the reduced pressure desiccator to the extent of 70° C., is lead to commence performing an oxidative polymerization on the filter paper, and left for a few hours as it is, thereby forming a black polypyrrole film on the surface of the filter paper. After sufficient polymerization, excess unreacted substance is washed away with distilled water, thereby forming an electrode of polypyrrole treated filter paper.

In this case, polypyrrole is uniformly adhered onto the surface of respective fibers of the filter paper, without preventing porosity of the filer paper itself. In this way, polypyrrole treated filter paper becomes an electrical conductor having resistivity of substantially $10^3$ to $10^4$ $ohm/cm^3$ in the surface direction of the filter paper (1×1 $cm^2$).

Then, gel of polytungustic acid is carried and fixed on the polypyrrole film. This fixation may be performed in the vapor phase in the same manner the formation of polypyrrole. In this case, a solution 2 of sodium tungstic acid is used instead of the solution 2 of oxidizing agent and hydrochloric acid is used instead of polypyrrole. The gel of polytungustic acid formed on the filter paper is fixed on the fiber of the filter paper in the form of fine particles in the same procedure. A schematic diagram in which the electrode of filter paper is observed by a scanning electron microscope, is shown in FIG. 2. The magnitude of the fine particle can be controlled by changing the concentration of the solution of sodium tungstic acid.

Since whole manufacturing steps are proceeded in the vapor phase, the regions carrying the reaction substance are masked as described above, so that this embodiment has a merit that the treating steps can simply be controlled.

FIG. 2 shows the construction of the composite electrode thus manufactured. In FIG. 2(A), reference numeral 6 is a fiber of the glass fiber filter paper, reference numeral 7 is a fiber of the filter paper after polypyrrole coating, and reference numeral 3 is a fine particle of gel of tungstic acid.

This electrode is manufactured in such a manner that the polypyrrole electrode portion and the carrying portion of gel of polytungustic acid form an interface. Also, schematic diagrams in which the electrode surface of filter paper is observed by the scanning electron microscope, are shown in FIGS. 2(A), 2(B) and 2(C), respectively.

Figure 5:
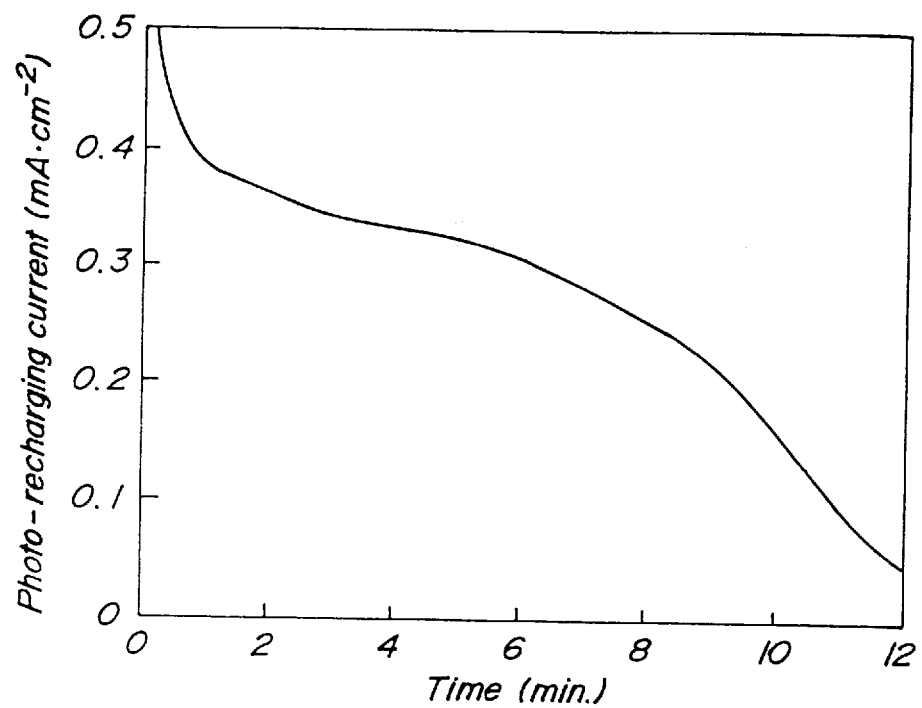
FIG. 5 is a characteristic view showing photo-charging currents charged by light, which is obtained by reducing the discharged currents in case of performing non-light irradiation from the discharge current after second light irradiation.

FIG. 3 shows a graph of discharging property obtained by examining a performance of a photo-rechargeable storage battery with the use of this electrode. This graph shows a comparison of a discharging current obtained by performing discharge for a reference electrode (Ag/AgCl electrode) after light irradiation for ten minutes with a discharging current obtained in case of performing non-light irradiation with the same procedure. In FIG. 3, abscissa shows a discharging time (minutes). In this measuring, aqueous solution of perchloric acid (1 mol/l) is used as an electrolyte, and xenon light (strength of irradiating light on electrode surface: 3W/$cm^2$) having spectral near solar light is used as a light source. As seen from this graph, the discharging current after light irradiation is larger than that in the case of non-light irradiation, so that this shows the feature of having the photo-rechargeable storage property. The photo-charging currents charged by light, which is obtained by reducing the discharged currents in case of performing non-light irradiation from the discharge current after light irradiation, is shown in FIG. 5. The magnitude of the photo-charging currents charged by light is an order of few hundreds $\mu A$, which is a sufficiently practical value in case of considering a light irradiation for ten minutes. The method of manufacturing electrode utilizing the filter paper in the vapor phase may also be applied to another conductive polymer. $TiO_2$ which has a many utilizations as a photo-catalyst, may also be carried in the fine cluster shape in the same way as the above, so that the present invention is technics having a wide application range, in addition of application to the photo-rechargeable storage battery.

FIG. 3 shows a characteristic view showing data of photo-charging currents (FIG. 5) of the composite electrode according to the present invention. The characteristic diagram showing photo-charging currents shown in FIG. 5 is obtained by exhibiting the difference between the discharging current in the case of non-light irradiation and the discharging current after the second light irradiation as a photo-charging current. While the measuring result shown in FIG. 5 exhibits the data obtained in case of repeating a following cycle continuously:

light irradiation for ten minutes → discharging (discharging after first light irradiation) → non-light irradiation → discharging (discharging after non-light irradiation) → light irradiation for ten minutes → discharging (discharging after second light irradiation)

The curves of photo-charging currents shown in FIG. 5 demonstrate that the recharging by the light is realized, since the discharging current after the second light irradiation is larger than the discharging current with non light irradiation (dark discharging).

Figure 4:
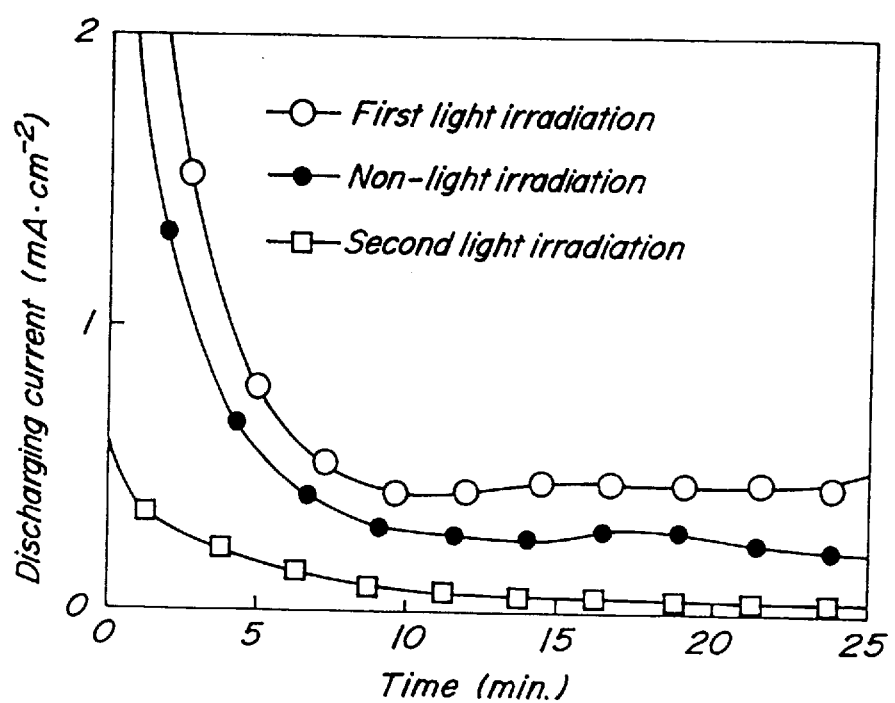
FIG. 4 is a characteristic view showing a relationship between a discharging current and a lapse of time in case of coating only polypyrrole on the filter paper.

FIG. 4 shows a characteristic diagram of the discharging current of the electrode which is formed by coating and polymerizing only polypyrrole on the filter paper, in order to exhibit that photo-rechargeability is caused only by manufacturing composite electrode.

By performing the same measurement as that shown in FIG. 3, it is found that in the electrode having only polypyrrole provided thereon, the discharging current is decreased with time lapse, irrespective of presence of light, so that electrode without gel of polytungustic acid does not have the photo-rechargeability.

FIG. 5 is a characteristic diagram of a photo-recharging current of the composite electrode according to the present invention, and this current is obtained as the difference between the discharging current with non light irradiation and the discharging current after second light irradiation.

The comparison between the composite electrode according to the present invention and the other electrode is shown in following table 1.

Table 1 shows the relationship among the composition of following electrodes, the magnitude of the photo-recharging current (photo-rechargeability), and the photo-voltaic force.

TABLE 1

Comparison to other electrodes

| Electrode | Photo-rechargeability (Photo-recharging Current) | Photo-voltaic force (Profile) |
|---|---|---|
| (1) CuFeTe$_2$ | ◯ ~10 µA/cm$^2$ | Presence |
| (2) Gel of Poly-Tungustic Acid + Graphite (Film Electrode) | ◯ ~1 µA/cm$^2$ | Presence |
| (3) Polythiophene | ◯ ~0.1 µA/cm$^2$ | Presence |
| (4) Polypyrrole | X | Absence |
| (5) Composite Electrode (Present Invention) | ◎ ~100 µA/cm$^2$ | Presence Broad |

Light Irradiation Commence (1) CuFeTe$_2$
(2) Gel of Polytungustic acid+graphite(film electrode)
(3) Polythiophene
(4) Polypyrrole
(5) Composite electrode according to the present invention The data shown in the table 1 should be compared with data of other research worker, but the research that the discharging current after light irradiation is measured as in the present invention, is not found, so that only the data measured by present inventors are illustrated.

It is found from this table 1, that the photo-recharging current of the composite electrode according to the present invention is very large.

Figure 6:
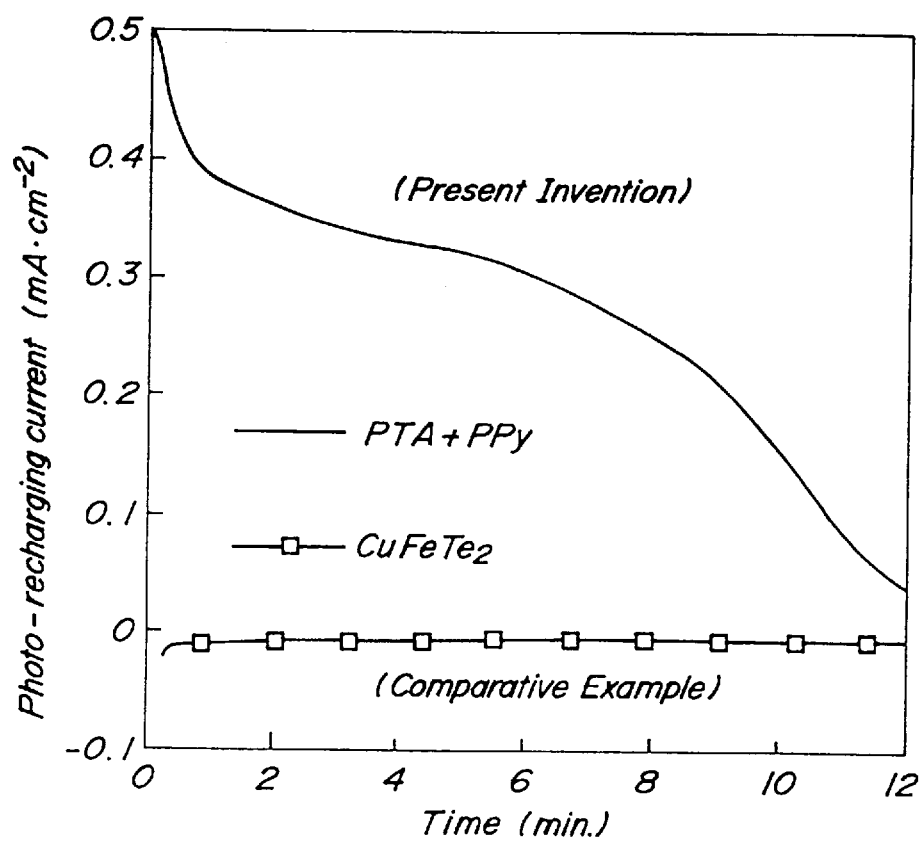
FIG. 6 is a characteristic view of photo-charging currents obtained by subjecting a comparative examination of an electrode obtained by forming a conductive film having rechargeability of polypyrrole on the filter paper and forming sol of polytungustic acid (PTA) on the thus formed conductive film and $CuFeTe_2$ of the intercalation layer semiconductor compound.

FIG. 6 shows a comparison of characteristics of the photo-recharging current charged by light with the use of both CuFeTe$_2$ having comparative large photo-rechargeability and the composite electrode according to the present invention. It is found from FIG. 6 that the composite electrode according to the present invention flows the photo-recharging current having the order of tens times of that of conventional electrode, and thus this composite electrode has a high photo-rechargeability.

Experimental Example

The present inventors have tested the photo-rechargeability of series obtained by dispersing photo-functional particles into conductive polymer having recharging property. In conventional electrode, polythiophene is used as a conductive polymer. However, polythiophene has large semiconductivity in the condition that doping is not performed, so that it is difficult to design an electrode so as to respond it to light together with the photo-functional particles. However, in the present invention, polypyrrole which has comparatively metallic conductivity is used as a conductive polymer, and its electro-chemical property and photo-rechargeable property are tested. Polypyrrole is apt to polymerize as compared with polythiophene, so that various manufacturing method are possible and thus the manufacture of composite electrode can be realized by combining it with the photo-functional particles.

Manufacture of Electrode

A filter paper which is applied by solution of FeCl$_3$ is treated with pyrrole vapor, thereby forming a polypyrrole electrode. In this way, polypyrrole electrode can be manufactured having flexibility and strength by using the filter paper as basic material. TiO$_2$ as a photo-functional particle and sol of polytungustic acid are carried onto the polypyrrole electrode, thereby forming a composite electrode.

Result

FIG. 7 shows a cyclic voltamogram of the polypyrrole filter paper electrode obtained by dispersing TiO$_2$ powder and sol of polytungustic acid and carrying them onto the filter paper. It is found from FIG. 7 that when TiO$_2$ powder of various amount of photo-functional particles and various amount of sol of polytungustic acid are carried onto the polypyrrole filter paper respectively, various cyclic voltamagram may be obtained. This means that charge migration between the polypyrrole filter paper electrode and the photo-functional particles is present. Moreover, it is found that the polypyrrole electrode using this filter paper increases its reacting region by reflecting porous of the filter paper, and large current can be obtained as compared with conventional film electrode due to common electro-deposition.

As described above, according to the present invention, high performance electrode having very high ratio surface area can be manufactured by applying a manufacture of electrode in the vapor phase with the use of the filter paper as a base material to other devices. Moreover, the semiconductor can be fixed as a particle, so that the present invention can be applied to other devices utilizing a size effect which is not present in the conventional semiconductor electrode. This manufacturing technic is very general purpose technic, since it can be applied to other semiconductor material capable of manufacturing it with the sol-gel method and other polymer.

Moreover, various different kinds of semiconductor materials may be mixed as a fine particle, so that a photo-electrode having wide absorption spectrum can be manufactured by forming composite electrode with the use of semiconductor having different light absorption bands. In this way, the manufacture of electrode in the vapor phase with the use of the filter paper as a base material is very advantageous in industry.

What is claimed is:

1. A method of manufacturing a photo-rechargeable storage battery, comprising a. cutting a filter paper of glass fiber as a base material in a preselected shape to provide a cut filter paper;
   b. washing the cut filter paper;
   c. coating a polypyrrole film on at least a portion of a surface of the cut filter paper; and
   d. carrying a gel of poly-tungustic acid having a form of clusters on at least a portion of the glass fiber coated with the polypyrrole film thereby forming a composite electrode on the filter paper.

2. The method according to claim 1, wherein step (d) is accomplished by:
  i. immersing the filter paper into a solution containing sodium tungstate to impregnate at least a portion of the filter paper, and;
  ii. introducing hydrochloric acid in gas phase as a catalytic vapor into the filter paper thereby forming the gel of poly-tungustic acid.

3. The method according to claim 2, wherein steps (i) and (ii) are repeated thereby forming an electrode having a specific surface area which is extremely large.

4. The method according to claim 1, wherein coating a polypyrrole film on at least a portion of a surface of the cut filter paper is accomplished by vapor deposition.

* * * * *